(12) United States Patent
Kusahara et al.

(10) Patent No.: US 10,481,229 B2
(45) Date of Patent: Nov. 19, 2019

(54) MAGNETIC-RESONANCE IMAGING APPARATUS

(71) Applicant: Toshiba Medical Systems Corporation, Otawara-shi (JP)

(72) Inventors: Hiroshi Kusahara, Utsunomiya (JP); Yuki Takai, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 261 days.

(21) Appl. No.: 15/349,294

(22) Filed: Nov. 11, 2016

(65) Prior Publication Data

US 2017/0139023 A1    May 18, 2017

(30) Foreign Application Priority Data

Nov. 13, 2015    (JP) ................................. 2015-223393

(51) Int. Cl.
| | |
|---|---|
| *G01V 3/00* | (2006.01) |
| *G01R 33/385* | (2006.01) |
| *G01R 33/48* | (2006.01) |
| *G01R 33/28* | (2006.01) |
| *G01R 33/3873* | (2006.01) |
| *G01R 33/54* | (2006.01) |
| *G01R 33/483* | (2006.01) |

(52) U.S. Cl.
CPC ....... *G01R 33/3856* (2013.01); *G01R 33/283* (2013.01); *G01R 33/3873* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

| 7,741,847 B2 | 6/2010 | Nakabayashi et al. |
| 8,058,873 B2 | 11/2011 | Timinger |
| | (Continued) | |

FOREIGN PATENT DOCUMENTS

| JP | 2000-23939 | 1/2000 |
| JP | 2002-159465 | 6/2002 |
| | (Continued) | |

OTHER PUBLICATIONS

Japanese Office Action dated Sep. 17, 2019 in Japanese Patent Application JP2015-223393, citing references AO-AP therein (4 pages).

*Primary Examiner* — Giovanni Astacio-Oquendo
*Assistant Examiner* — Raul J Rios Russo
(74) *Attorney, Agent, or Firm* — Oblon, McClelland, Maier & Neustadt, L.L.P.

(57) ABSTRACT

A magnetic-resonance imaging apparatus of an embodiment includes a gradient coil, a transmitter coil, and a processing circuitry. The gradient coil applies a gradient magnetic field to an imaging space in which a subject is placed. The transmitter coil applies a RF (radio frequency) pulse to the imaging space. The processing circuitry calculates a target temperature of the gradient coil throughout multiple protocols to be executed in an examination of the subject, and controls a temperature of the gradient coil to approach the target temperature when a data used to set a center frequency of the RF pulse is measured.

10 Claims, 13 Drawing Sheets

(52) U.S. Cl.
CPC ....... *G01R 33/482* (2013.01); *G01R 33/4816* (2013.01); *G01R 33/4818* (2013.01); *G01R 33/4822* (2013.01); *G01R 33/4824* (2013.01); *G01R 33/4826* (2013.01); *G01R 33/546* (2013.01); *G01R 33/483* (2013.01); *G01R 33/4831* (2013.01)

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/387; G01R 33/246; G01R 33/389
USPC .................................................. 324/300–322
See application file for complete search history.

(56) References Cited

U.S. PATENT DOCUMENTS

| | | | |
|---|---|---|---|
| 8,536,869 | B2 | 9/2013 | Kawamoto |
| 8,836,330 | B2 | 9/2014 | Kanazawa |
| 2015/0123661 | A1* | 5/2015 | Yui ...................... G01R 33/543 324/318 |
| 2015/0168523 | A1* | 6/2015 | Ishihara ............. G01R 33/5659 324/318 |
| 2015/0316633 | A1* | 11/2015 | Imamura ............. G01R 33/385 324/322 |
| 2016/0038054 | A1* | 2/2016 | Benner .................. A61B 5/055 600/413 |
| 2016/0109546 | A1* | 4/2016 | Machii ............ G01R 33/56554 324/322 |
| 2016/0274207 | A1* | 9/2016 | Kondo ............ G01R 33/56581 |
| 2017/0045590 | A1* | 2/2017 | Takai ................. G01R 33/0082 |
| 2017/0045595 | A1* | 2/2017 | Machii ............... G01R 33/3852 |

FOREIGN PATENT DOCUMENTS

| | | |
|---|---|---|
| JP | 2008-114051 | 5/2008 |
| JP | 2010-508936 | 3/2010 |
| JP | 2010-269136 | 12/2010 |
| JP | 2011-010760 A | 1/2011 |
| JP | 2011-143235 | 7/2011 |
| JP | 2014-213084 A | 11/2014 |
| JP | 2017-35306 A | 2/2017 |

* cited by examiner

→ FLOW OF COOLING WATER
---→ FLOW OF SIGNAL

FIG.7

| PROTOCOL | LOCATOR | SHIMMING | DWI | TOF | T2WI | T1WI | 3D | T2*WI |
|---|---|---|---|---|---|---|---|---|
| IMAGING TIME | 0:20 | 0:10 | 4:00 | 5:00 | 3:00 | 3:00 | 5:00 | 3:00 |

FIG.8

| PROTOCOL | BEFORE IMAGING | LOCATOR | SHIMMING | DWI | TOF | T2WI | T1WI | 3D | T2*WI |
|---|---|---|---|---|---|---|---|---|---|
| ESTIMATION TEMPERATURE PER PROTOCOL | 20 | 20 | 20 | 42 | 32 | 25 | 25 | 32 | 25 |

FIG.9

| PROTOCOL | BEFORE IMAGING | LOCATOR | | SHIMMING | | DWI | | TOF | | T2WI | | T1WI | | 3D | | T2*WI | |
|---|---|---|---|---|---|---|---|---|---|---|---|---|---|---|---|---|---|
| | | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF |
| TEMPERATURE OF GRADIENT COIL | 20 | 22 | 23 | 24 | 22 | 28 | 29 | 27 | 28 | 25 | 24 | 24 | 23 | 25 | 26 | 25 | 25 |
| ESTIMATION TEMPERATURE PER PROTOCOL | 20 | 20 | | 20 | | 42 | | 32 | | 25 | | 25 | | 32 | | 25 | |

FIG.10

| PROTOCOL | BEFORE IMAGING | LOCATOR | | SHIMMING | | DWI | | TOF | | T2WI | | T1WI | | 3D | | T2*WI | |
|---|---|---|---|---|---|---|---|---|---|---|---|---|---|---|---|---|---|
| | | FIRST HALF | LATTER HALF | FIRST HALF | LATTER HALF | FIRST HALF | LATTER HALF | FIRST HALF | LATTER HALF | FIRST HALF | LATTER HALF | FIRST HALF | LATTER HALF | FIRST HALF | LATTER HALF | FIRST HALF | LATTER HALF |
| TEMPERATURE OF GRADIENT COIL | 20 | 22 | 23 | 24 | 22 | 28 | 29 | 27 | 28 | 25 | 24 | 24 | 23 | 25 | 26 | 25 | 25 |
| ESTIMATION TEMPERATURE PER PROTOCOL | 20 | 20 | | 20 | | 42 | | 32 | | 25 | | 25 | | 32 | | 25 | |
| TEMPERATURE OF COOLING WATER | 20 | 24 | 24 | 24 | 10 | 10 | 12 | 12 | 18 | 20 | 20 | 20 | 16 | 16 | 20 | 20 | 20 |

FIG.13

| PROTOCOL | BEFORE IMAGING | LOCATOR | | SHIMMING | | DWI | | TOF | | T2WI | | T1WI | | 3D | | T2*WI | |
|---|---|---|---|---|---|---|---|---|---|---|---|---|---|---|---|---|---|
| | | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF |
| TEMPERATURE OF GRADIENT COIL | 20 | 22 | 23 | 24 | 22 | 28 | 29 | 27 | 28 | 25 | 24 | 24 | 23 | 25 | 26 | 25 | 25 |
| ESTIMATION TEMPERATURE PER PROTOCOL | 20 | 20 | | 20 | | 42 | | 35 | | 25 | | 25 | | 32 | | 25 | |
| TEMPERATURE OF COOLING WATER | 20 | 24 | 24 | 24 | 10 | 10 | 10 | 10 | 18 | 20 | 20 | 20 | 16 | 16 | 20 | 20 | 20 |

FIG.14

| PROTOCOL | BEFORE IMAGING | LOCATOR | | SHIMMING | | DWI | | TOF | | T1WI | | T2WI | | 3D | | T2*WI | |
|---|---|---|---|---|---|---|---|---|---|---|---|---|---|---|---|---|---|
| | | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF |
| TEMPERATURE OF GRADIENT COIL | 20 | 22 | 23 | 24 | 22 | 28 | 29 | 27 | 28 | 25 | 24 | 24 | 23 | 25 | 26 | 25 | 25 |
| ESTIMATION TEMPERATURE PER PROTOCOL | 20 | 20 | | 20 | | 42 | | 32 | | 25 | | 25 | | 32 | | 25 | |
| TEMPERATURE OF COOLING WATER | 20 | 24 | 24 | 24 | 10 | 10 | 12 | 12 | 18 | 20 | 20 | 20 | 16 | 16 | 20 | 20 | 20 |

FIG.15

| PROTOCOL | BEFORE IMAGING | LOCATOR | | SHIMMING | | DWI | | TOF | | T2WI | | T1WI | | T2*WI | |
|---|---|---|---|---|---|---|---|---|---|---|---|---|---|---|---|
| | | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF | FIRST HALF | LAT-TER HALF |
| TEMPERATURE OF GRADIENT COIL | 20 | 22 | 23 | 24 | 22 | 28 | 29 | 27 | 28 | 25 | 24 | 24 | 23 | 25 | 25 |
| ESTIMATION TEMPERATURE PER PROTOCOL | 20 | 20 | | 20 | | 42 | | 32 | | 25 | | 25 | | 25 | |
| TEMPERATURE OF COOLING WATER | 20 | 24 | 24 | 24 | 10 | 10 | 12 | 12 | 18 | 20 | 20 | 20 | 20 | 20 | 20 |

MAGNETIC-RESONANCE IMAGING APPARATUS

CROSS-REFERENCE TO RELATED APPLICATIONS

This application is based upon and claims the benefit of priority from Japanese Patent Application No. 2015-223393, filed on Nov. 13, 2015; the entire contents of which are incorporated herein by reference.

FIELD

Embodiments described herein relate generally to a magnetic-resonance imaging apparatus.

BACKGROUND

Magnetic-resonance imaging (MRI) apparatuses have been available in which nuclear spins of a subject that is placed in a static magnetic field are magnetically excited by radio frequency (RF) pulses at Larmor frequency, and an image is reconstructed from a magnetic resonance (MR) signal that is generated with this excitation.

Such a magnetic-resonance imaging apparatus causes, for example, cooling water to flow into a gradient coil in which a metal shim is provided, measures the temperature of the cooling water a has flown out from the gradient coil, and controls the temperature of the cooling water that is to flow back into the gradient coil again, thereby suppressing fluctuation in temperature of the metal shim. In another example, a magnetic-resonance imaging apparatus rises, for example, the temperature of a metal shim that is provided in a gradient coil before a protocol is executed, thereby suppressing fluctuation in temperature of the metal shim. Thus, fluctuation in a center frequency of an RF pulse is suppressed, and deterioration of an image quality of an image is suppressed.

BRIEF DESCRIPTION OF THE DRAWINGS

FIG. 7 is a table showing one example of a protocol set and imaging times that are set at step S101;

FIG. 8 is a table showing one example of estimation temperatures that are estimated per protocol;

FIG. 9 is a table showing one example of a temperature of the gradient coil set at step S104;

FIG. 10 is a table showing one example of a temperature of cooling water at is calculated at step S104;

FIG. 13 is a table for explaining one example of processing that is performed by an estimation function according to a first modification;

FIG. 14 is a table for explaining one example processing that is performed by an estimation function according to a second modification;

FIG. 15 is a table for explaining one example of processing that is performed by an estimation function according to a third modification;

DETAILED DESCRIPTION

A magnetic-resonance imaging apparatus of an embodiment includes a gradient coil, a transmitter coil, and a processing circuitry. The gradient coil applies a gradient magnetic field to an imaging space in which a subject is placed. The transmitter coil applies an RF pulse to the imaging space. The processing circuitry calculates a target temperature of the gradient coil throughout multiple protocols to be executed in an examination of the subject, and controls a temperature of the gradient coil to approach the target temperature when a data used to set a center frequency of the RF pulse is measured.

The magnetic-resonance imaging apparatus (hereinafter, "MRI apparatus" as appropriate) according to the embodiment is explained below with reference to the drawings. Embodiments are not limited to the embodiment below.

Figure 1:
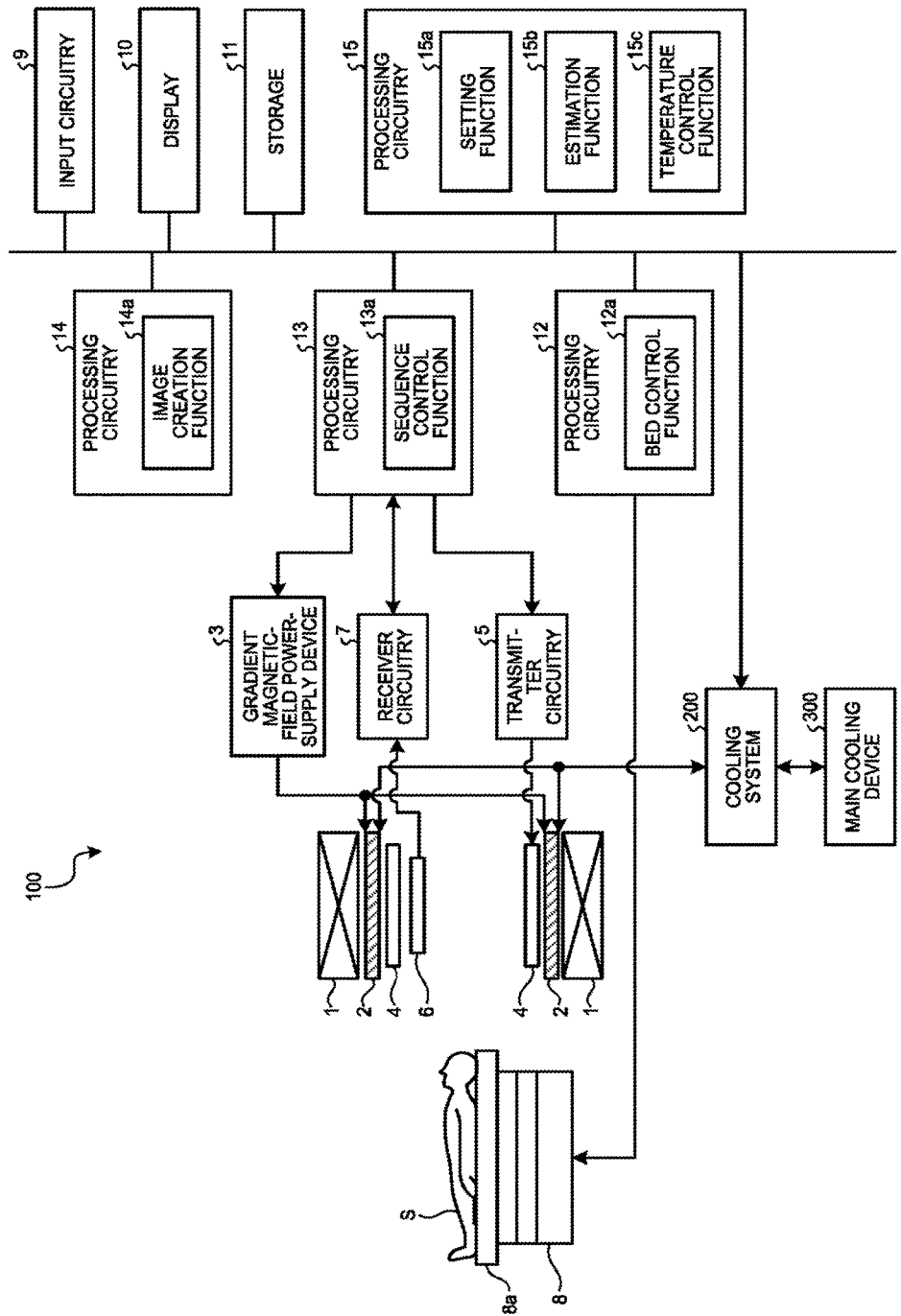
FIG. 1 is a block diagram showing a configuration of an MRI apparatus according to an embodiment.

FIG. 1 is a functional block diagram showing a configuration of an MRI apparatus 100 according to the embodiment. As shown in FIG. 1, the MRI apparatus 100 includes a static magnetic-field magnet 1, a gradient coil a gradient magnetic-field power-supply device 3, a transmitter coil 4, transmitter circuitry 5, a receiver coil 6, receiver circuitry 7, a couch 8, input circuitry 9, a display 10, storage 11, processing circuitries 12 to 15, and a cooling system 200. A subject S (for example, a human body) shown in FIG. 1 is not included in the MRI apparatus 100. The configuration shown in FIG. 1 is only one example.

Moreover, to the cooling system 200 of the MRI apparatus 100, a main cooling device 300 is connected.

The static magnetic-field magnet 1 is formed in a substantially cylindrical shape having a hollow (including one having an oval-shaped section that is perpendicular to a center axis of the cylindrical shape), and generates a uniform static magnetic field in an imaging space formed on an inner radius side. For example, the static magnetic-field magnet 1 is implemented by a permanent magnet, a superconducting magnet, or the like.

The gradient coil 2 is formed into a substantially cylindrical shape having a hollow (including one having an oval-shaped section that is perpendicular to a center axis of the cylindrical shape), and is positioned on an inner radius side of the static magnetic-field magnet 1. The gradient coil 2 includes three coils that generate gradient magnetic fields along an x axis, a y axis, and a z axis, respectively, that are perpendicular to each other. The x axis, the y axis, and the z axis constitute a device coordinate system unique to the MRI apparatus 100. For example, the direction of the x axis is set to a vertical direction, and the direction of the y axis is set to a horizontal direction. Moreover, the direction of the z direction is set to be the same as a direction of a magnetic flux of a static magnetic field generated by the static magnetic-field magnet 1. That the gradient coil 2 applies a gradient magnetic field to the imaging space in which the subject S is placed.

The gradient magnetic-field power-supply device 3 generates gradient magnetic fields along the x axis, the y axis, and the z axis, respectively, in the imaging space by providing a current individually to each of the three coils included in the gradient coil 2. By appropriately generating gradient magnetic fields respectively along the x axis, the y axis, and the z axis, gradient magnetic fields respectively along a read-out direction, a phase encoding direction, and a slice direction that are perpendicular to each other can be generated. The axes respectively along the read-out direction, the phase encoding direction, and the slice direction constitute a logical coordinate system to define a lice region or a volume region to be a subject of imaging. In the following, the gradient magnetic field along the read-out direction is referred to as a read-out gradient magnetic field, the gradient magnetic field along the phase encoding direction is referred to as a phase-encoding magnetic field, and the gradient magnetic field along the slice direction is referred to as a slice gradient magnetic field.

The respective gradient magnetic fields are superimposed on the static magnetic field that is generated by the static magnetic-field magnet 1, and is used to add spatial position information to a magnetic resonance (MR) signal. Specifically, the read-out gradient magnetic field adds position information along the read-out direction to the MR signal by changing a frequency of the MR signal according to a position in the read-out direction. Furthermore, the phase-encoding gradient magnetic field adds position information in the phase encoding direction to the MR signal by changing a phase of the MR signal along the phase encoding direction. Moreover, the slice gradient magnetic field is used to determine the direction, the thickness, and the number of slices of a slice region when an imaging region is a slice region, and adds position information along the slice direction to the MR signal by changing a phase of the MR signal according to a position in the slice direction.

The transmitter coil 4 is formed in a substantially cylindrical shape with hollow (including one having an oval-shaped section that is perpendicular to a center axis of the cylindrical shape), and is arranged inside the gradient coil 2. The transmitter coil 4 applies an RF pulse that is output from the transmitter circuitry 5 to the imaging space.

The transmitter circuitry 5 outputs an RF pulse corresponding to the Larmor frequency to the transmitter coil 4. For example, the transmitter circuitry 5 includes oscillation circuitry, phase selection circuitry, frequency conversion circuitry, amplitude modulation circuitry, and RF amplification circuitry. The oscillation circuitry generates an RF pulse having a resonance frequency of a subject nucleus that is placed in a static magnetic field. The phase selection circuitry selects a phase of the RF pulse output from the oscillation circuitry. The frequency conversion circuitry converts a frequency of the RF pulse output from the phase selection circuitry. The amplitude modulation circuitry modulates an amplitude of the RF pulse output from the frequency conversion circuitry according to, for example, a sine function. The RF amplification circuitry amplifies the RF pulse output from the amplitude modulation circuitry, to output to the transmitter coil 4.

The receiver coil 6 is arranged inside the gradient coil 2, and receives an MR signal that is emitted from the subject S by an influence of the RF pulse. Receiving an MR signal, the receiver coil 6 outputs the received MR signal to the receiver circuitry 7.

The receiver circuitry 7 generates MR signal data based on the MR signal that is output from the receiver coil 6, and outputs the generated MR signal data to the processing circuitry 13. For example, the receiver circuitry 7 includes selection circuitry, pre-amplification circuitry, phase detector circuitry, and analog/digital conversion circuitry. The selection circuitry selectively inputs the MR signal that is output from the receiver coil 6. The pre-amplification circuitry amplifies the MR signal output from the selection circuitry. The phase detector circuitry detects a phase of the MR signal that is output from a pre-amplifier. The analog/digital conversion circuitry generates MR signal data by converting an analog signal output from the phase detector into a digital signal, and outputs the generated MR signal data to the processing circuitry 13.

Although an example when the transmitter coil 4 transmits the RF pulse and the receiver coil 6 receives the MR signal is explained herein, forms of the transmitter coil and the receiver coil are not limited thereto. For example, the transmitter coil 4 can further include a reception function to receive an MR signal. Moreover, the receiver coil 6 can further include a transmission function to transmit the RF pulses. When the transmitter coil 4 has a reception function, the receiver circuitry 7 generates MR signal data from an MR signal received by the transmitter coil 4 also. Furthermore, when the receiver coil 6 has a transmission function, the transmitter circuitry 5 outputs an RF pulse also to the receiver coil 6.

The couch 8 includes a top plate 8a on which the subject S is placed, and inserts the top plate 8a into an imaging space that is formed inside the static magnetic-field magnet 1 and the gradient coil 2 when imaging of the subject S is performed. For example, the couch 8 is arranged such that the longitudinal direction thereof is parallel to the center axis of the static magnetic-field magnet 1.

The input circuitry 9 receives an input operation of various kinds of instructions and various kinds of information from an operator. For example, the input circuitry 9 is implemented by a trackball, a switch button, a mouse, a keyboard, a touch panel, and the like. The input circuitry 9 is connected to the processing circuitry 15, and converts an received input operation from an operator into an electrical signal to output to the processing circuitry 15.

The display 10 displays various kinds of information and various kinds of images. For example, the display 10 is implemented by a liquid crystal monitor or a cathode ray tube (CRT) monitor, a touch panel, and the like. The display 10 is connected to the processing circuitry 15, and converts various kinds of information and various kinds of images that are transmitted from the processing circuitry 15 into an electrical signal for display to output.

The storage 11 stores various kinds of data. For example, the storage 11 stores MR signal data or image data per subject S. For example, the storage 11 is implemented by a semiconductor memory device such as a random access memory (RAM) and a flash memory, a hard disk, an optical disk, and the like.

The processing circuitry 12 has a couch control function 12a. For example, the processing circuitry 12 is implemented by a processor. The couch control function 12a is connected to the couch 8, and controls an action of the couch 8 by outputting an electrical signal for control to the couch 8. For example, the couch control function 12a receives an instruction to move the top plate 8a in the longitudinal direction, a vertical direction, or a horizontal direction from an operator, and causes a driving mechanism of the top plat 8a included in the couch 8 to operate such that the top plate 8a moves according to the received instruction.

The processing circuitry 13 has a sequence control function 13a. For example, the processing circuitry 13 is implemented by a processor. Specifically, the sequence control function 13a executes various kinds of protocols. The sequence control function 13a executes various kinds of protocols by driving the gradient magnetic-field power-supply device 3, the transmitter circuitry 5, and the receiver circuitry 7 based on sequence execution data that is output from the processing circuitry 15.

The sequence execution data is information which defines protocol indicating procedure to collect the MR signal data. Specifically, the sequence execution data include information such as a timing for the gradient magnetic-field power-supply device 3 to supply a current to the gradient coil 2, an intensity of the current, an intensity of an RF pulse current supplied by the transmitter circuitry 5 to the transmitter coil 4 and a timing for the supply, a detection timing for the receiver circuitry 7 to detect an MR signal.

Moreover, the sequence control function 13a receives MR signal data from the receiver circuitry 7 as a result of executing various pulse sequences, and stores the received MR signal in the storage 11. A set of MR signal data received by the sequence control function 13a is arranged in a two-dimensional alignment or a three-dimensional alignment according to position information that is added thereto with the read-out gradient magnetic field, the phase-encoding gradient magnetic field, and the slice magnetic field described above, and thus stored in the storage 11 as data constituting a k-space.

The processing circuitry 14 has an image creation function 14a. For example, the processing circuitry 14 is implemented by a processor. The image creation function 14a creates an image based on the MR signal data stored in the storage 11. Specifically, the image creation function 14a reads the MR signal data stored in the storage 11 by the sequence control function 13a, and subjects the read MR signal data to post-processing, namely, reconstruction processing such as the Fourier transform, thereby creating an image. Moreover, the image creation function 14a stores image data of the created image in the storage 11.

The processing circuitry 15 performs overall control of the MRI apparatus 100 by controlling the respective components included in the MRI apparatus 100. For example, the processing circuitry 15 is implemented by a processor. For example, the processing circuitry 15 has a setting function 15a, an estimation function 15b, and a temperature control function 15c. Out of these, the setting function 15a receives an input of at least one protocol that is an imaging condition from an operator through the input circuitry 9, and generates sequence execution data based on the received protocol. The setting function 15a then transmits the generated sequence execution data to the processing circuitry 13, thereby controlling the sequence control function 13a to execute various kinds of protocols. For example, the processing circuitry 15 reads image data that is requested by the operator from the storage 11, and outputs the image indicated by the read image data to the display 10. Details of various kinds of processing functions of the setting function 15a, the estimation function 15b, and the temperature control function 15c are described later.

The respective processing functions of the setting function 15a, the estimation function 15b, and the temperature control function 15c, which are components of the processing circuitry 15, are stored in a form of a program that can be executed by a computer, for example, in the storage 11. The processing circuitry 15 reads out each program from the storage 11, and executes the read program, and thus the function corresponding to each program is implemented. In other words, the processing circuitry 15 that has read each program is to have each function indicated in the processing circuitry 15. Although it is explained, in FIG. 1, that a single unit of the processing circuitry 15 implements the respective processing functions of the setting function 15a, the estimation function 15b, and the temperature control function 15c, the processing circuitry 15 can be constituted of multiple independent processors, and the processors can implement the respective processing functions by executing the respective programs.

The word "processor" used in the above explanation signifies circuitry such as a central processing unit (CPU), a graphical processing unit (GPU), an application specific integrated circuit (ASIC), a programmable logic device (for example, simple programmable logic device (SPLD), a complex programmable logic device (CPLD), and a field programmable gate array (FPGA)), and the like. Instead of storing the programs in the storage 11, the programs can be directly installed in circuitry of the processor. In this case, the processor reads out and executes the program installed in the circuitry, and thus implements the function.

Note that some or all out of the processing circuitry 12, the processing circuitry 13, the processing circuitry 14, and the processing circuitry 15, can be implemented by the same processor.

The cooling system 200 supplies water, the temperature of which is controlled, to a cooling tube 2f of the gradient coil 2. For example, the gradient coil 2 is cooled by supplying low temperature water to the cooling tube 2f of the gradient coil 2. Moreover, for example, the gradient coil 2 is heated by supplying warm water to the cooling tube 2f of the gradient coil 2. The cooling system 200 controls the temperature of water that flows into and back from the cooling tube 2f of the gradient coil 2, and then supplies it to the cooling tube 2f again. Thus, the cooling system 200 circulates water between itself and the gradient coil 2, thereby controlling the temperature of the gradient coil 2. The temperature of an iron shim 2e that is provided in the gradient coil 2 described later increases as the temperature of the gradient coil 2 increases. Furthermore, the temperature of the iron shim 2e decreases as the temperature of the gradient coil 2 decreases. Therefore, the cooling system 200 controls the temperature of the iron shim 2e by controlling the temperature of the gradient coil 2. Details of the cooling system 200 are described later.

Note that even if water, the temperature of which is controlled to predetermined temperature is provided into the gradient coil 2, when a current is supplied to the gradient coil 2 and the gradient coil 2 generates heat, the temperature of the iron shim 2e becomes higher than the temperature of the water, affected by the heat of the gradient coil 2.

As above, the entire configuration of the MRI apparatus 100 according to the embodiment has been explained.

A conventional MRI apparatus, which is different from the MRI apparatus 100 according to the embodiment, is described herein. The conventional MRI apparatus suppresses fluctuation in temperature of a metal shim that is provided in the gradient coil. For example, the conventional MRI measures a temperature of the cooling water that is flown out from the gradient coil, and controls the temperature of the cooling water that is to be recirculated to the gradient coil. In this case, there is a difference between the measured temperature of the water flown out and the actual temperature of the metal shim. That is, the conventional MRI apparatus controls the temperature of the gradient coil and the metal shim with a time delay. Therefore, as a result of insufficient suppression of fluctuation in temperature of the gradient coil, there is a problem that suppression of fluctuation in temperature of the metal shim is insufficient. Accordingly, an image that is reconstructed by such an MRI apparatus has a problem such as an artifact occurring therein. That is, in terms of the image quality of an image to be acquired, there is an influence thereof to an examination of a subject.

Furthermore, a case in which a conventional MRI apparatus, which is different from the MRI apparatus 100 according to the embodiment, increases a temperature of a metal shim that is provided in a gradient coil before a protocol is executed, thereby suppressing a fluctuation in temperature of the metal shim is explained. In this case, there is a problem that it takes time to increase the temperature of the metal shim through the gradient coil. Accordingly, the examination time for a subject becomes long. That is, in terms of length of an examination time, there is an influence thereof to an examination of a subject.

On the basis of the configuration described above, the MRI apparatus 100 according to the embodiment is configured to be able to estimate information useful for reducing an influence of a change in temperature of the gradient coil with time to an examination of the subject S, as details are explained below.

Figure 2:
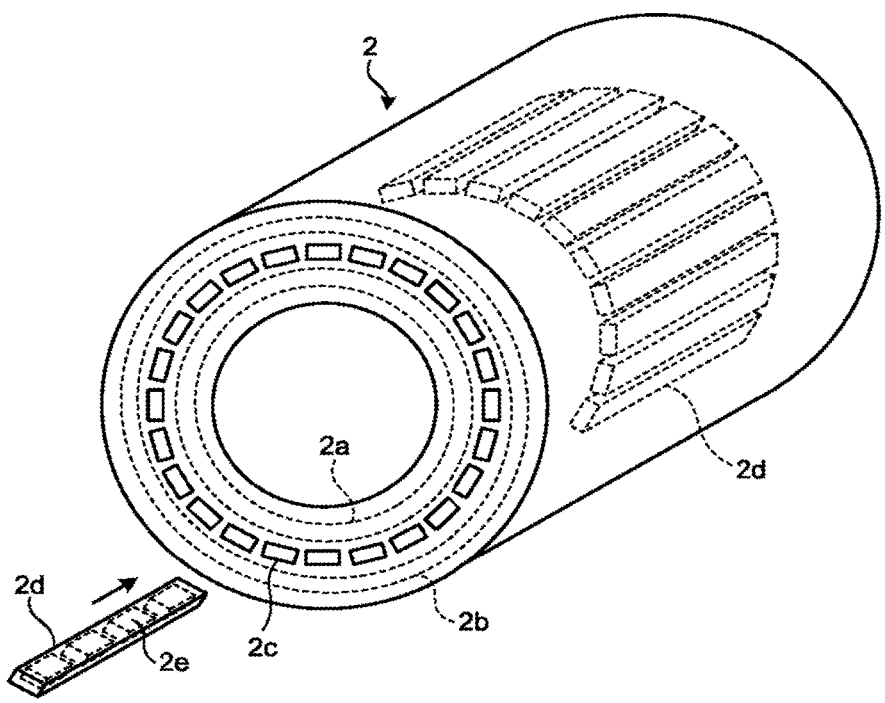
FIG. 2 is a perspective view showing one example of a structure of a gradient coil.

Next, one example of a configuration of the gradient coil 2 shown in FIG. 1 is explained. FIG. 2 is a perspective view showing one example of a structure of the gradient coil 2. As shown in the example in FIG. 2, the gradient coil 2 includes a main coil 2a that applies a gradient magnetic field in an X axis direction, a Y axis direction, and a Z axis direction by a current supplied from the gradient magnetic-field power-supply device 3, and a shield coil 2b that cancels a leakage magnetic field of the main coil 2a.

Between the main coil 2a and the shield coil 2b, plural shim-tray insert guides 2c are formed. Into the shim-tray insert guide 2c, a shim tray 2d that houses the iron shim 2e to adjust inhomogeneity of a static magnetic field in a bore is inserted. The iron shim one example of a metal shim.

Each of the shim-tray insert guides 2c is a through hole having an opening on an each of end surfaces of the gradient coil 2, and is formed throughout the length of the gradient coil in the longitudinal direction. The respective shim-tray insert guides 2c are formed in parallel to each other at regular intervals in a direction of circumference in an area between the main coil a and the shield coil 2b. In each of the shim-tray insert guides 2c, the shim tray 2d is inserted.

The shim tray 2d is formed with a resin that is a non-magnetic and non-conductive material, and forms a substantially a stick shape. In the shim tray 2d, a predetermined number of the iron shims 2e are housed. The shim tray 2d is inserted into the shim-tray insert guide 2c, and is fixed at a central portion of the gradient coil 2.

Figure 3:
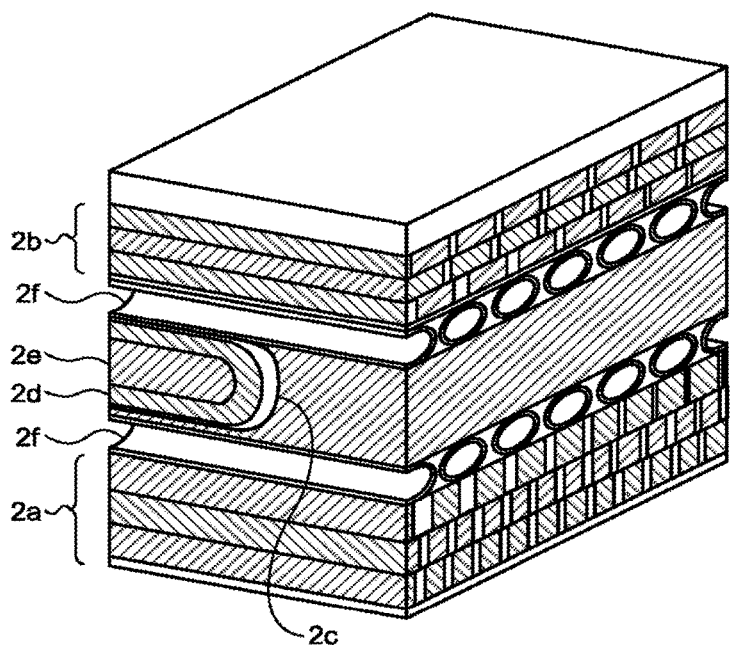
FIG. 3 is a structural drawing showing one example of an internal structure of the gradient coil shown in FIG. 2.

Furthermore, although illustration is omitted in FIG. 2, a cooling tube is embedded in the gradient coil, for example, spirally along the cylindrical shape. FIG. 3 is a structural drawing showing one example of an internal structure of the gradient coil 2 shown in FIG. 2. FIG. 3 shows a part of the gradient coil 2, and an upper side in the drawing shows the outer side of the cylindrical shape, and the lower side shows an inner side of the cylindrical shape.

As shown in the example in FIG. 3, in the gradient coil 2, the cooling tube 2f is embedded spirally inside and outside of the shim-tray insert guide 2c, that is, between the shim-tray insert guide 2c and the main coil 2a, and between the shim-tray insert guide 2c and the shield coil 2b. Into the cooling tube 2f, cooling water that is sent from the cooling system 200 flows, and the cooling water that flows therein travel through the cooling tube 2f and circulates inside the gradient coil 2, and then flows out of the gradient coil 2. Thus, the cooling water circulates inside the gradient coil 2 by traveling thorough the cooling tube 2f, and the gradient coil 2 and the iron shim 2e provided in the gradient coil 2 are thereby cooled. The main coil 2a includes a coil corresponding to the X axis, a coil corresponding to the Y axis, and a coil corresponding to the axis. In the present embodiment, temperature that is obtained by the action of the temperature of the coil corresponding to the X axis, the temperature of the coil corresponding to the Y axis, and the temperature of the coil corresponding to the Z axis is regarded as the temperature of the gradient coil.

Figure 4:
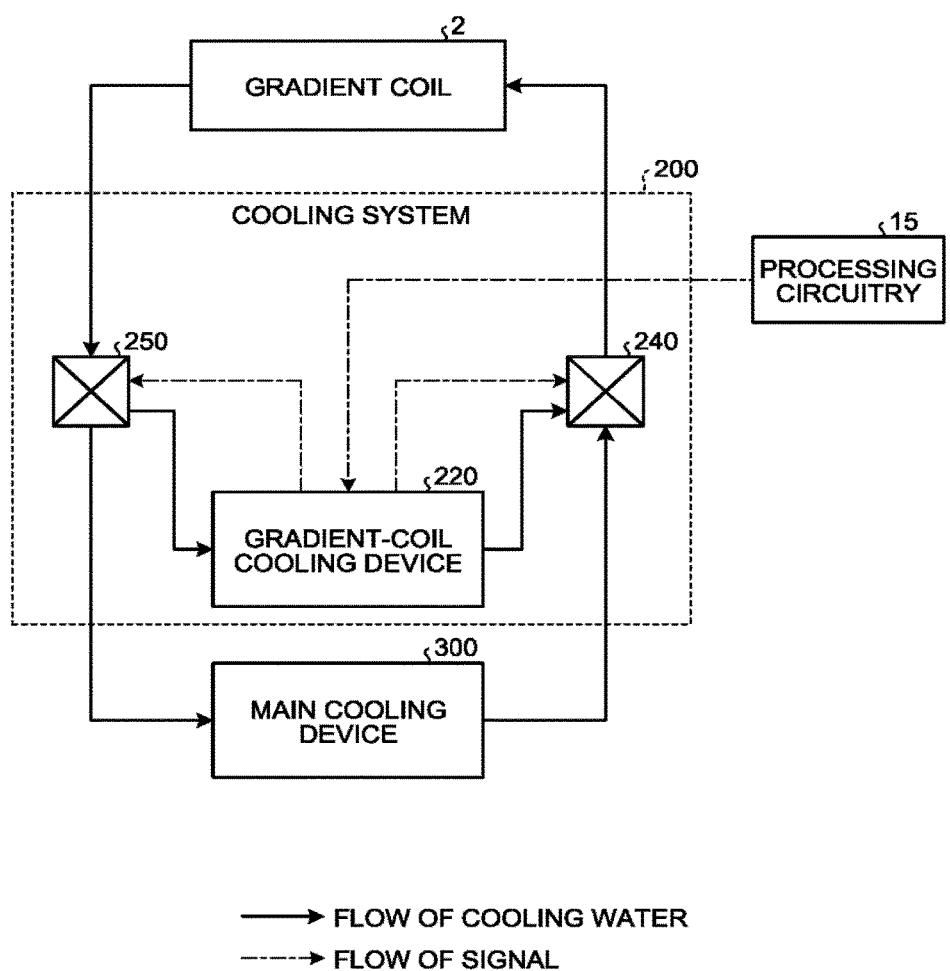
FIG. 4 is a block diagram showing a configuration of cooling system according to the embodiment.

Next, a configuration of the cooling system 20C according to the present embodiment is explained. FIG. 4 is a block diagram showing a configuration of the cooling system 200 according to the embodiment. As shown in FIG. 4, the cooling system 200 includes a gradient-coil cooling device 220, a valve 240, and a valve 250.

The valves 240 and 250 control the flow of cooling water that is provided to the gradient coil 2 from the main cooling device 300 and the gradient-coil cooling device 220 under control of the gradient-coil cooling device 220.

These valves 240 and 250 can let only either one of the cooling water provided by the main cooling device 300 and the cooling water provided by the gradient-coil cooling device 220 flow through the gradient coil 2. Moreover, the valves 240 and 250 can mix the cooling water from the respective cooling devices to let it flow through the gradient coil 2, and can adjust the ratio of mixing cooling waters appropriately also.

The main cooling device 300 makes cooling water to flow through a cooling tube of the gradient coil 2. Specifically, this main cooling device 300 causes the cooling water at a certain temperature to flow through the gradient coil 2 through a flowing path via the valve 240. Moreover, the main cooling device 300 takes in the cooling water that flows out of the gradient coil 2 through the flowing path via the valve 250. Although illustration is omitted in FIG. 4, the main cooling device 300 causes the cooling water to flow into various units other than the gradient coil 2.

The gradient-coil cooling device 220 causes cooling water to flow through the gradient coil 2 through a flowing path of the cooling water that is provided between the main cooling device 300 and the gradient coil 2. This gradient-coil cooling device 220 is connected to the processing circuitry 15, the valve 240 and the valve 250 to be able to communicate with each other.

Specifically, the gradient-coil cooling device 220 provides cooling water having temperature higher than the cooling water that is provided from the main cooling device 300 to the flowing path connecting from the main cooling device 300 to the gradient coil 2 via the valve 240. Furthermore, the gradient-coil cooling device 220 takes in a part of the cooling water that flows out of the gradient coil 2 through the valve 250.

In the present embodiment, the gradient-coil cooling device 220 controls the state of the cooling water that flows through the gradient coil 2 from the main cooling device 300, thereby changing the temperature of the cooling water that flows in to the gradient coil 2. Thus, in the present embodiment, it is configured to be able to suppress variation in temperature of the gradient coil 2 according to the magnitude of heat generated during scanning. In the following, the gradient-coil cooling device 220 is explained in detail.

Figure 5:
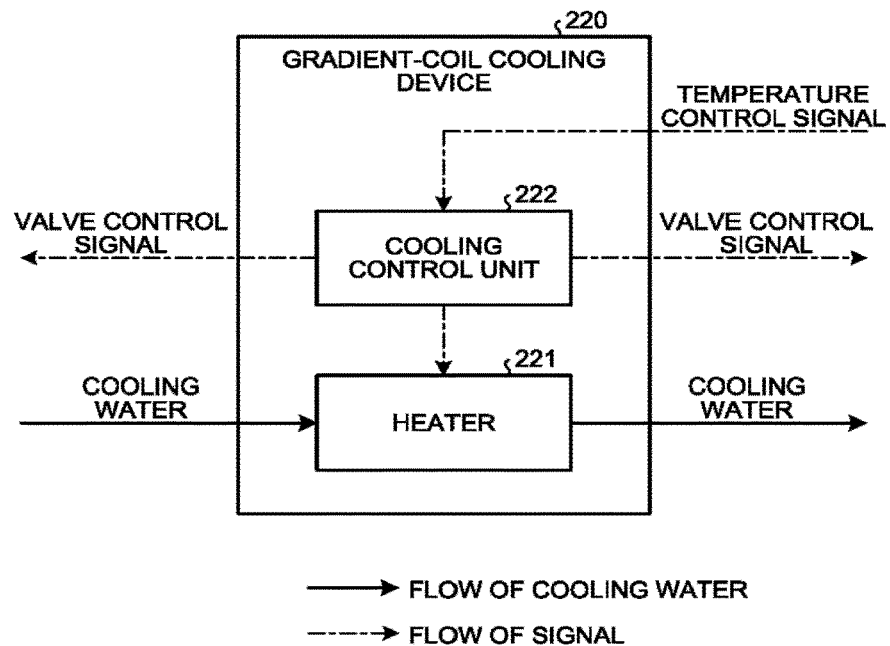
FIG. 5 is a block diagram showing a configuration of a gradient-coil cooling device according to the embodiment.

First, a configuration of the gradient-coil cooling device 220 according to the present embodiment is explained. FIG. 5 is a gradient-coil cooling device 220. FIG. 5 is a block diagram showing a configuration of the gradient-coil cooling device 220 according to the embodiment. As shown in FIG. 5, the gradient-coil cooling device 220 includes a heater 221 and a cooling control unit 222.

The heater 221 heats the cooling water that is provided by the gradient-coil cooling device 220. For example, the heater 221 appropriately controls the temperature of the cooling water provided by the gradient-coil cooling device 220 by changing heating temperature to heat the cooling water under control of the cooling control unit 222.

The cooling control unit 222 changes the temperature of the cooling water that flows into the gradient coil 2 based on a temperature control signal that is transmitted from the temperature control function 15c described later. Specifically, the cooling control unit 222 controls the heater 221 and the valve 240 and the valve 250 such that the temperature of the cooling water that flows into the gradient coil 2 is the temperature of the cooling water indicated in the temperature control signal. Note that the "temperature of the cooling water indicated in the temperature control signal" includes an error within a predetermined allowable range.

The cooling control unit 222 controls the valves 240 and 250 so that the cooling water from the main cooling device 300 and the cooling water from the gradient-coil cooling device 220 are mixed to flow into the gradient coil 2 by transmitting a valve control signal.

Next, respective processing functions of the setting function 15a, the estimation function 15b, and the temperature control function 15c that are executed by the processing circuitry 15 shown in FIG. 1 are explained. The MRI apparatus 100 according to the present embodiment performs temperature-control-data generation processing to generate temperature control data, and temperature control processing to perform temperature control of the gradient coil 2 while a protocol is being executed (during imaging) after the temperature control data is created.

Figure 6:
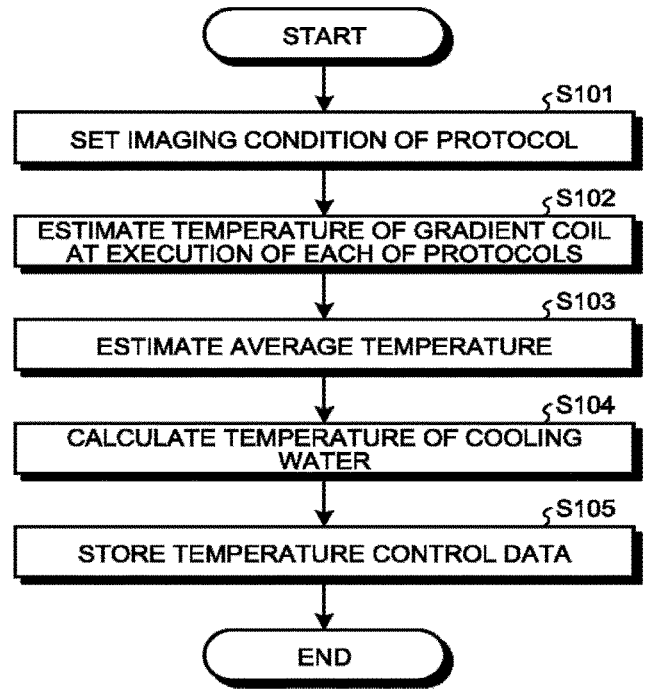
FIG. 6 is a flowchart indicating a flow of temperature-control-data generation processing.

First, the temperature-control-data generation processing is explained. FIG. 6 is a flowchart indicating a flow of the temperature-control-data generation processing. The temperature-control-data generation processing is performed, for example, when an instruction to perform the temperature-control-data generation processing from an operator is received through the input circuitry 9.

As shown in FIG. 6, the setting function 15a receives parameters of a protocol set and each protocol included in the protocol set be executed in an examination of the subject S from an operator as an imaging condition of a protocol (imaging condition included in a protocol), and stores the received imaging condition of the protocol in the storage 11, thereby setting the imaging condition of the protocol (step S101). The imaging condition is a condition that is set for imaging. For example, the imaging condition includes setting information such as an imaging time, a reception time (RT), an echo time (TE), a flip angle (FA), the number of slices (NS), a field of view (FOV), and a thickness of slice (ST). Moreover, the examination in the present embodiment is, for example, a set of at least one protocol. One examination is performed on one subject S. Moreover, in one protocol, for example, data collection such as imaging according to one pulse sequence is performed.

For example, the setting function 15a displays an imaging-condition setting screen to receive an imaging condition of a protocol on the display 10, and receives an input of an imaging condition of a protocol by an operator through the input circuitry 9. The setting function 15a stores the received imaging condition of the protocol in the storage 11, and generates sequence execution data according to the received imaging condition of the protocol. For example, the setting function 15a sets a protocol set that is selected by an operator from among multiple protocol sets that re preset in the storage 11 as a protocol set to be executed in an examination of the subject S. Furthermore, the setting function 15a sets various kinds of parameters such as an imaging time set by the operator as an imaging condition.

The respective protocols in the set protocol set are sequentially extracted, and various kinds of data collection such as imaging is performed according to the extracted protocol.

FIG. 7 is a table showing one example of a protocol set and imaging times that are set at step S101. A protocol "locator" shown in the example in FIG. 7 is a protocol to perform imaging of a positioning image. Moreover, a protocol "shimming" shown in the example in FIG. 7 is a protocol to adjust homogeneity of a magnetic field for example, static magnetic field). In the protocol "shimming", measurement of a center frequency of an RF pulse is also performed. For example, in the protocol "shimming", measurement of a data used to set a center frequency of an RF pulse is also performed. Furthermore, a protocol "DWI" shown in the example in FIG. 7 is a protocol to perform imaging of a diffusion weighted image. Moreover, a protocol "TOF" shown in the example in FIG. 7 is a protocol to perform imaging by a time of flight (TOF) method. Furthermore, a protocol "T2WI" shown in the example in FIG. 7 is a protocol to perform imaging of a transverse relaxation weighted image (T2 weighted image). Moreover, a protocol "T1WI" is a protocol to perform imaging of a longitudinal relaxation weighted image (T1 weighted image). Furthermore, a protocol "3D" shown in the example in FIG. 7 is a protocol to perform imaging of a three-dimensional image. Moreover, a protocol "T2*WI" is a protocol to perform imaging of a T2 star weighted image (T2*weighted image).

That is, the example in FIG. 7 indicates that imaging of a positioning image is performed for 20 seconds. Further, the example in FIG. 7 indicates that imaging to adjust homogeneity of a magnetic field and the like is performed for 10 seconds, and measurement of a center frequency of an RF pulse is performed. For example, the example in FIG. 7 indicates at imaging to adjust homogeneity of a magnetic field and the like is performed for 10 seconds, and measurement of a data used to set a center frequency of an RF pulse is performed. Moreover, the example in FIG. 7 indicates that imaging of a diffusion weighted image is performed for 4 minutes. Furthermore, the example in FIG. 7 indicates that imaging by the TOF method is performed for minutes. Moreover, the example in FIG. 7 indicated that imaging of a transverse relaxation weighted image is performed for 3 minutes. Furthermore, the example in FIG. 7 indicates that imaging of longitudinal relaxation weighted image is performed for 3 minutes. Moreover, the example in FIG. 7 indicates that imaging of a three-dimensional image is performed for 5 minutes. Furthermore, the example in FIG. 7 indicates that imaging a T2*weighted image is performed for 3 minutes.

Returning back to explanation of FIG. 6, next, the estimation function 15b estimates the temperature of the gradient coil 2 at the time of executing each of the protocols based on the imaging condition of the protocols (step S102). For example, the estimation function 15b estimates a change in temperature of the gradient coil 2 in an examination based on a waveform of a pulse sequence per protocol. The estimation function 15b then estimates the largest value of temperature from the estimated change in temperature as the temperature of the gradient coil 2 at the time of executing each protocol. In the following, the estimated temperature can be expressed as "estimation temperature". That is, the estimation function 15b calculates an estimation temperature as terminal temperature of the gradient coil 2 corresponding to each of the protocols.

FIG. 8 is a table showing one example of estimation temperatures that are estimated per protocol. As shown in the example in FIG. 8, the estimation function 15b estimates an estimation temperature "20 degrees" for the protocol "locator". Moreover, the estimation function 15b estimates an estimation temperature "20 degrees" for the protocol "shimming". Furthermore, the estimation function 15b estimates an estimation temperature "42 degrees" for the protocol "DWI". Moreover, the estimation function 15b estimates an estimation temperature "32 degrees" for the protocol "TOF". Furthermore, the estimation function 15b estimates an estimation temperature "25 degrees" for the protocol "T2WI". Moreover, the estimation function 15b estimates an estimation temperature "25 degrees" for the protocol "T1WI". Furthermore, the estimation function 15b estimates an estimation temperature "32 degrees" for the protocol "3D". Moreover, the estimation function 15b estimates an estimation temperature "25 degrees" for the protocol "T2*WI". In the example in FIG. 8, the temperature "20 degrees" of the gradient coil 2 before the protocol "locator" is executed, that is, before first imaging is started in the examination is also indicated.

Returning back to explanation of FIG. 6, next, the estimation function 15b estimates an average temperature of the gradient coil 2 in the examination of the subject S based on the estimated temperatures (step S103). For example, the estimation function 15b connects changes in temperature of the gradient coil 2 estimated per protocol, and calculates the change in temperature of the gradient coil 2 in the entire examination. The estimation function 15b then calculates an average temperature of the gradient coil in the entire examination from changes in temperature of the gradient coil 2 in the entire examination. For example, when an estimation temperature is estimated as shown in the example in FIG. 8, the estimation function 15b calculates an average temperature "24 degrees" of the gradient coil 2 in the entire examination. As described, the estimation function 15b calculates an average temperature as a target temperature of the gradient coil 2 to be targeted throughout multiple protocols to be executed in an examination of the subject S. Moreover, the estimation function 15b calculates an average temperature (target temperature) according to an estimation temperature (terminal temperature) of the gradient coil 2 respectively corresponding to multiple protocols. That is, the estimation function 15b calculates an average of terminal temperature values corresponding to multiple protocols to be executed in an examination, as a target temperature.

The average temperature estimated at step S103 is used when temperature of the cooling water calculated at step S104 described later is calculated. It is described later, but this temperature of the cooling water described later is used to perform temperature control of the gradient coil 2 without delay in time for the actual temperature of the gradient coil 2. Therefore, according to the MRI apparatus 100 according to the present embodiment, an average temperature can be estimated as useful information to suppress an influence of a change in temperature of the gradient coil 2 with time to an examination result.

The estimation function 15b then calculates the temperature of the cooling water for each of the protocols so that the temperature of the gradient coil 2 at the time of executing each of the protocols is to be approximated to the average temperature, based on the temperature of the gradient coil 2 at the time of executing each of the protocols estimated at step S102 and the average temperature estimated at step S103 (step S104).

For example, at step S104, the estimation function 15b first sets the temperature of the gradient coil such that the temperature of the gradient coil 2 becomes lower as the estimation temperature becomes higher relative to the average temperature for each of the protocols.

The estimation function 15b sets the temperature of the gradient coil 2 such that particularly the temperature of the gradient coil 2 at the time of executing the protocol "shimming" to approach the average temperature when the protocol "shimming" to measure a center frequency of an RF pulse is included in the set multiple protocols. Thus, the temperature of the gradient coil 2 at the time when the center frequency of the RF pulse is measured is to be substantially the average temperature. For example, the temperature of the gradient coil 2 at the time when the data used to set the center frequency of the RF pulse is measured is to be substantially the average temperature. Moreover, as described above, the temperature of the gradient coil 2 at the time of executing protocols other than the protocol "shimming" is also set to approach the average temperature. Therefore, it is possible to suppress increase in difference between a center frequency of an RF pulse that is measured by the protocol "shimming" and a center frequency of an RF pulse at the time of executing protocols other than the protocol "shimming". For example, it is possible to suppress increase in difference between a center frequency of an RF pulse indicated by the data that is measured by the protocol "shimming" and a center frequency of an RF pulse at the time of executing protocols other than the protocol "shimming". Accordingly, fluctuation of a center frequency of an RF pulse in an examination can be suppressed.

Furthermore, the estimation function 15b can set the both temperatures per protocol such that the temperature of the gradient coil 2 at the time when a predetermined time, for example, of several seconds to several tens of seconds has passed since execution of a protocol is started and the temperature of the gradient coil 2 a predetermine time, for example, of several seconds to several tens of seconds before the execution of the protocol is completed are approximated to the average temperature.

FIG. 9 is a table showing one example of a temperature of the gradient coil 2 set at step S104. The temperature of the gradient coil 2 in a "first half" shown in the example in FIG. 9 is the temperature of the gradient coil 2 at the time when a predetermined time of several seconds to several tens of seconds has passed since execution of a protocol is started. Moreover, the temperature of the gradient coil 2 in a "latter half" shown in the example in FIG. 9 is the temperature of the gradient coil 2 a predetermined time of several second to several tens of seconds before the execution of the protocol is completed.

As shown in the example in FIG. 9, to approximate the temperature of the gradient coil 2 when a predetermined time of several seconds to several tens of seconds has passed since execution of the protocol "locator" is started to the average temperature "24 degrees", the estimation function 15b sets "22 degrees" as the temperature at this timing. Moreover, for the same reason, the estimation function 15b sets "23 degrees" as the temperature of the gradient coil a predetermined time of several seconds to several tens of seconds before the execution of the protocol "locator" is completed.

As shown in the example in FIG. 9, to approximate particularly the temperature of the gradient coil 2 when a predetermined time of several seconds to several tens of seconds has passed since execution of the protocol "shimming" is started to the average temperature "24 degrees", the estimation function 15b sets "24 degrees" as the temperature of the gradient coil 2 at this timing. Furthermore, for the same reason, the estimation function 15b sets "22 degrees" as the temperature of the gradient coil 2 a predetermined time of several seconds to several tens of seconds before the execution of the protocol "shimming" is completed.

Moreover, as shown in the example in FIG. 9, to approximate the temperature of the gradient coil 2 when a predetermined time of several seconds to several tens of seconds has passed since execution of the protocol "DWI" is started to the average temperature "24 degrees" the estimation function 15b sets "28 degrees" as the temperature of the gradient coil 2 at this timing. Furthermore, for the same reason, the estimation function 15b sets "29 degrees" as the temperature of the gradient coil 2 a predetermined time of several seconds to several tens of seconds before the execution of the protocol "DWI" is completed. Because the protocol "DWI" is a protocol to increase the temperature of the gradient coil 2, the temperature of the gradient coil 2 is to be relatively high.

Moreover, as shown in the example in FIG. 9, to approximate the temperature of the gradient coil 2 when a predetermined time of several seconds to several tens of seconds has passed since execution of the protocol "TOF" is started to the average temperature "24 degrees", the estimation function 15b sets "27 degrees" as temperature of the gradient coil 2 at this timing. Furthermore, for the same reason, the estimation function 15b sets "28 degrees" as the temperature of the gradient coil 2 a predetermined time of several seconds to several tens of seconds before the execution of the protocol "TOF" is completed.

Moreover, as shown in the example in FIG. 9, to approximate the temperature of the gradient coil 2 when a predetermined time of several seconds to several tens of seconds has passed since execution of the protocol "T2WI" is started to the average temperature "24 degrees", the estimation function 15b sets "25 degrees" as the temperature of the gradient coil 2 at this timing. Furthermore, for the same reason, the estimation function 15b sets "24 degrees" as the temperature of the gradient coil 2 a predetermined time of several seconds to several tens of seconds before the execution of the protocol "T2WI" is completed.

Moreover, as shown in the example in FIG. 9, to approximate the temperature of the gradient coil 2 when a predetermined time of several seconds to several tens of seconds has passed since execution of the protocol "TINT." is started to the average temperature "24 degrees", the estimation function 15b sets "24 degrees" as the temperature of the gradient coil. 2 at this timing. Furthermore, for the same reason, the estimation function 15b sets "23 degrees" as the temperature of the gradient coil 2 a predetermined time of several seconds to several tens of seconds before the execution of the protocol "T1WI" is completed.

Moreover, as shown in the example in FIG. 9, to approximate the temperature of the gradient coil 2 when a predetermined time of several seconds to several tens of seconds has passed since execution of the protocol "3D" is started to the average temperature "24 degrees", the estimation function 15b sets "25 degrees" as the temperature of the gradient coil 2 at this timing. Furthermore, for the same reason, the estimation function 15b sets "26 degrees" as the temperature of the gradient 2 a predetermined time of several seconds to several tens of seconds before the execution of the protocol "3D" is completed.

Moreover, as shown in the example in FIG. 9, to approximate the temperature of the gradient coil 2 to when a predetermined time of several seconds to several tens of seconds has passed since execution of the protocol "T2*WI" is started the average temperature "24 degrees", the estimation function 15b sets "25 degrees" as the temperature of the gradient coil at this timing. Furthermore, for the same reason, the estimation function 15b sets "25 degrees" as the temperature of the gradient coil 2 a predetermined time of several seconds to several tens of seconds before the execution of the protocol "T2*WI" is completed.

Subsequently, at step S104, the estimation function 15b calculates the temperature of the cooling water such that the temperature of the gradient coil 2 is to be the set temperature of the gradient coil 2 when each protocol is executed. For a protocol with an estimation temperature higher that of a protocol executed previously by a predetermined threshold (for example, 7 degrees) or more, that is, for a protocol by which the estimation temperature rises suddenly, the previous low temperature is calculated as the temperature of the cooling water at the time of executing a protocol that is executed previously to this protocol so that the low-temperature cooling water flows into the gradient coil 2 upon starting execution of this protocol, or before executing this protocol for a protocol with an especially high estimation temperature. As described, the estimation function 15b calculates the temperature of the cooling water for each protocol such that low-temperature cooling water flows into the gradient coil 2 substantially at the same time as start of execution of a protocol for which the estimation temperature suddenly increases to high temperature. This enables to suppress increase of the temperature of the gradient coil 2 by a protocol by which the estimation temperature suddenly increases to high temperature, and to suppress a change in temperature of the gradient coil 2 by a protocol by which the estimation temperature suddenly increases to high temperature.

FIG. 10 is a table showing one example of temperature of the cooling water that is calculated at step 3104. As shown in the example in FIG. 10, the estimation function 15b calculates "24 degrees" as the temperature of the cooling water when a predetermined time of several seconds to several tens of seconds has passed since execution of the protocol "locator" is started. Moreover, the estimation function 15b calculates "24 degrees" as the temperature of the cooling water a predetermined time of several seconds to several tens of seconds before the execution of the protocol "locator" is completed.

Furthermore, as shown in the example in FIG. 10, the estimation function 15b calculates "24 degrees" as the temperature of the cooling water when a predetermined time of several seconds to several tens of seconds has passed since execution of the protocol "shimming" is started. Moreover, the estimation function 15*b* calculates "10 degrees" as the temperature of the cooling water a predetermined time of several seconds to several tens of seconds before the execution of the protocol "shimming" is completed. The reason why the low temperature "10 degree" is calculated at this timing is because the protocol "DWI" to be executed next is a protocol by which the estimation temperature suddenly increases to high temperature. Thus, the low-temperature cooling water flows into the gradient coil 2 substantially at the same time as start of execution of the protocol "DWI".

Furthermore, as shown in the example in FIG. 10, the estimation function 15*b* calculates "10 degrees" as the temperature of the cooling water when a predetermined time of several seconds to several tens of seconds has passed since execution of the protocol "DWI" is started. Moreover, the estimation function 15*b* calculates "12 degrees" as the temperature of the cooling water a predetermined time of several seconds to several tens of seconds before the execution of the protocol "DWI" is completed.

Furthermore, as shown in the example in FIG. 10, the estimation function 15*b* calculates "12 degrees" as the temperature of the cooling water when a predetermined time of several seconds to several tens of seconds has passed since execution of the protocol "TOF" is started. Moreover, the estimation function 15*b* calculates "18 degrees" as the temperature of the cooling water a predetermined time of several seconds to several tens of seconds before the execution of the protocol "TOF" is completed.

Furthermore, as shown in the example in FIG. 10, the estimation function 15*b*, calculates "20 degrees" as the temperature of the cooling water when a predetermined time of several seconds to several tens of seconds has passed since execution of the protocol "T2WI" is started. Moreover, the estimation function 15*b* calculates "20 degrees" as the temperature of the cooling water a predetermined time of several seconds to several tens of seconds before the execution of the protocol "T2WI" is completed.

Furthermore, as shown in the example in FIG. 10, the estimation function 15*b* calculates "20 degrees" as the temperature of the cooling water when a predetermined time of several seconds to several tens of seconds has passed since execution of the protocol "T1WI" is started. Moreover, the estimation function 15*b* calculates "16 degrees" as the temperature of the cooling water a predetermined time of several seconds to several tens of seconds before the execution of the protocol "T1WI" is completed. The reason why the low temperature "16 degree" is calculated at this timing is because the protocol "3D" to be executed next is a protocol by which the estimation temperature suddenly increases to high temperature. Thus, the low-temperature cooling water flows into the gradient coil 2 substantially at the same time as start of execution of the protocol "3D".

Furthermore, as shown in the example in FIG. 10, the estimation function 15*b* calculates "16 degrees" as the temperature of the cooling water when a predetermined time of several seconds to several tens of seconds has passed since execution of the protocol "3D" is started. Moreover, the estimation function 15*b* calculates "20 degrees" as the temperature of the cooling water a predetermined time of several seconds to several tens of seconds before the execution of the protocol "3D" is completed.

Furthermore, as shown in the example in FIG. 10, the estimation function 15*b* calculates "20 degrees" as the temperature of the cooling water when a predetermined time of several seconds to several tens of seconds has passed since execution of the protocol "T2*WI" is started. Moreover, the estimation function 15*b* calculates "20 degrees" as the temperature of the cooling water a predetermined time of several seconds to several tens of seconds before the execution of the protocol "T2*WI" is completed.

Returning back to explanation of FIG. 6, the estimation function 15*b* stores the temperature control data in the storage 11 (step S105), and ends the temperature-control-data generation processing. For example, the estimation function 15*b* generates temperature control data in which the estimation temperature calculated at step S102, the temperature of the gradient coil set at step S104, and the temperature of the cooling water calculated at step S104 are associated with each other per protocol. The estimation function 15*b* then stores the generated temperature control data in the storage 11. For example, the estimation function 15*b* generates temperature control data as shown in the example in FIG. 10 and stores the generated temperature control data in the storage 11.

Step S101 is a step corresponding to the setting function 15*a*. It is a step at which the processing circuitry 15 reads a predetermined program that corresponds to the setting function 15*a* from the storage 11, thereby implementing the setting function 15*a*. Steps S102 to S105 are steps corresponding to the estimation function 15*b*. These are steps at which the processing circuitry 15 reads a predetermined program that corresponds to the estimation function 15*b* from the storage 11, thereby implementing the estimation function 15*b*.

Figure 11:
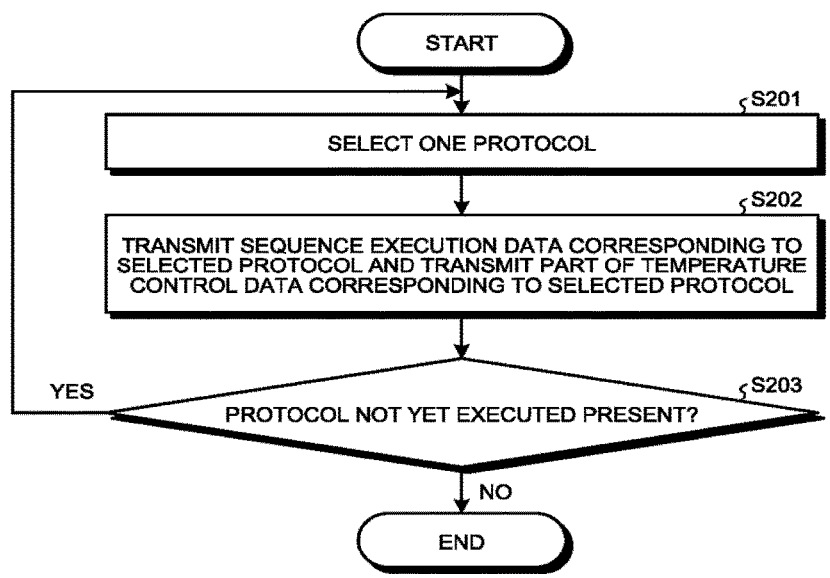
FIG. 11 is a flowchart indicating a flow of temperature control processing.

Next, the temperature control processing is explained. FIG. 11 is a flowchart indicating a flow of the temperature control processing. The temperature control processing is performed, for example, when an instruction to perform the temperature control processing is received from an operator through the input circuitry 9.

As shown in the example in FIG. 11, the setting function 15*a* first selects one protocol that has not been executed from one close to the top, from among protocols set in a predetermined execution sequence (order to execute protocols) (step S201).

Subsequently, the setting function 15*a* transmits sequence execution data that corresponds to the selected protocol to the sequence control function 13*a* of the processing circuitry 13 when the time to execute the selected protocol has come, and the temperature control function 15*c* transmits a part of the temperature control data corresponding to the selected protocol to the cooling system 200 (step S202).

For example, when protocols as shown in the example in FIG. 8 above are set and the protocol "locator" is selected at step S201, the setting function 15*a* transmits sequence execution data that corresponds to the protocol "locator" to the sequence control function 13*a* at the time when the protocol "locator" is executed. Moreover, the temperature control function 15*c* acquires temperature control data from the storage 11, and transmits a temperature control signal that includes information about the temperature of the cooling water corresponding to the protocol "locator" to the cooling system 200 at the time when the protocol "locator" is executed. Thus, the sequence control function 13*a* executes the protocol "locator" and the cooling system 200 makes the cooling water at the temperature of the cooling water indicated by the temperature control signal flow into the gradient coil 2, synchronising to execution of the protocol "locator". That is, the MRI apparatus 100 calculates the temperature of the cooling water at step S104 using the average temperature estimated at step S103, to perform temperature control of the gradient coil 2 without delay to actual temperature of the gradient coil 2 by using the calculated temperature of the cooling water. As described, the temperature control function 15c controls the temperature of the gradient coil 2 as the temperature of the iron shim 2e while executing multiple protocols by the sequence control function 13a. Therefore, according to the MRI apparatus 100 according to the present embodiment, an influence of a change in temperature of the gradient coil 2 with time to an examination result can be suppressed.

Furthermore, when protocols as shown in the example in FIG. 8 above are set and the protocol "shimming" is selected at step S201, the setting function 15a transmits sequence execution data that corresponds to the protocol "shimming" to the sequence control function 13a at the time when the protocol "shimming" is executed. Moreover, the temperature control function 15c acquires temperature control data from the storage 11, and transmits a temperature control signal that includes information about the temperature of the cooling water corresponding to the protocol "shimming" to the cooling system 200 at the time when the protocol "shimming" is executed. Thus, the sequence control function 13a executes the protocol "shimming" and the cooling system 200 makes the cooling water at the temperature of the cooling water indicated by the temperature control signal flow into the gradient coil 2, synchronizing to execution of the protocol "shimming". That is, the temperature control function 15c controls the temperature of the gradient coil 2 to approach the average temperature (target temperature) when a data used to set a center frequency of an RF pulse is measured.

Subsequently, the setting function 15a determines whether a protocol that has not been executed is present among the set protocols (step S203). When determining that a protocol that has not been executed is present (step S103: YES), the setting function 15a returns to step S201. Thus, the processing at step S201 and step S202 is performed for all of the set protocols.

On the other hand, when determining that no protocol that has not been executed is present (step S203: NO), the setting function 15a ends the temperature control processing.

Steps S201 and S203 are steps that corresponds to the setting function 15a. These are steps at which the processing circuitry 15 reads and executes a predetermined program that corresponds to the setting function 15a from the storage 11, thereby implementing the setting function 15a. Step S202 is a step that corresponds to the setting function 15a and the temperature control function 15c. These are steps at which the processing circuitry 15 reads and executes a predetermined program that corresponds to the setting function 15a and the temperature control function 15c, thereby implementing the setting function 15a and the temperature control function 15c.

Figure 12:
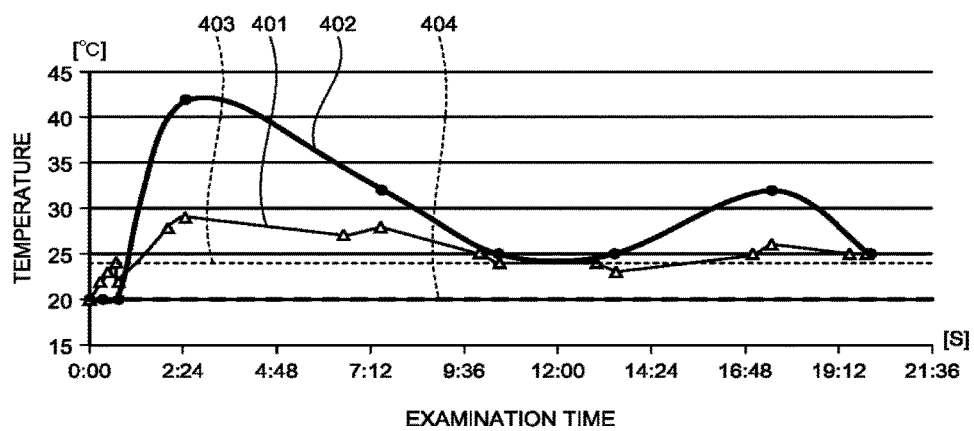
FIG. 12 is a graph for comparing a result of temperature control of the gradient coil by the MRI apparatus according to the embodiment and a result of temperature control of the gradient coil when the MRI apparatus causes cooling water to flow into the gradient coil in which a metal shim is provided, measures temperature of the cooling water that has flown out of the gradient coil, and controls the temperature of the cooling water that flows back into the gradient coil again based on the measured temperature.

FIG. 12 is a graph for comparing a result of temperature control of the gradient coil 2 by the MRI apparatus 100 according to the embodiment and a result of temperature control of the gradient coil when the MRI apparatus causes cooling water to flow into the gradient coil in which a metal shim is provided, measures temperature of the cooling water that has flown out of the gradient coil, and controls the temperature of the cooling water to flow back into the gradient coil again based on the measured temperature.

In the example in FIG. 12, a graph 401 and a graph 402 in which a horizontal axis is examination time, and a vertical axis is temperature of a gradient coil are shown. The graph 401 shows changes in temperature of the gradient coil 2 by the MRI apparatus 100 according to the embodiment. The graph 402 shows changes in temperature of the gradient coil when the MRI apparatus makes the cooling water flow into the gradient coil in which a metal shim is provided, measures the temperature of the cooling water that flows cut of the gradient coil, and controls the temperature of the cooling water that flows back into the gradient coil again based on the measured temperature.

Furthermore, the example in FIG. 12 shows a temperature 403 and a temperature 404. The temperature 403 is the temperature (average temperature described above) of the gradient coil 2 when a center frequency of an RF pulse is measured in the MRI apparatus 100 according to the embodiment. For example, the temperature 403 is the temperature (average temperature described above) of the gradient coil 2 when a data used to set a center frequency of an RF pulse is measured. The temperature 404 is the temperature of the gradient coil when a center frequency of an RF pulse is measured in the MRI apparatus that makes cooling water flow into the gradient coil in which a metal shim is provided, measures the temperature of the cooling water that flows out of the gradient coil, and controls the temperature of the cooling water to flow back into the gradient coil again based on the measured temperature. For example, the temperature 404 is the temperature of the gradient coil when a data used to set a center frequency of an RF pulse is measured in the MRI apparatus that makes cooling water flow into the gradient coil in which a metal shim is provided, measures the temperature of the cooling water that flows out of the gradient coil, and controls the temperature of the cooling water to flow back into the gradient coil again based on the measured temperature.

As shown in FIG. 12, fluctuation of the temperature indicated by the graph 401 for the temperature 403 is smaller than fluctuation in temperature indicated by the graph 402 for the temperature 404. This also shows that according the MRI apparatus 100 according to the present embodiment, an influence of a change in temperature of the gradient coil 2 with time to an examination result.

As above, the MRI apparatus 100 according to the embodiment has been explained. According to the MRI apparatus 100, as described above, information useful for suppressing an influence of a change in temperature of the gradient coil 2 with time to an examination result can be estimated.

(First Modification According to Embodiment.)

The MRI apparatus 100 described above can estimate, even when an imaging condition of a protocol is modified during an examination, the temperature of the gradient coil 2 at the time of executing the protocol based on the imaging condition of the protocol subjected to modification, and can control the temperature of the gradient coil 2 based on the estimated temperature. Therefore, such an embodiment is explained as a first modification of the embodiment.

For example, a case in which a modification is made to the protocol "TOF" shown in the example in FIG. 8 by an operator is explained. In this case, the estimation function 15b according to the first modification estimates the temperature of the gradient coil 2 at the time of executing the protocol "TOF" based on an imaging condition to which a modification has been made, similarly to the processing at step S102 described above.

FIG. 13 is a table for explaining one example of processing that is performed by an estimation function according to the first modification. As shown in the example in FIG. 13, the estimation function 15b according to the first modification estimates a temperature "35 degrees" of the gradient coil 2 at the time of execution of the protocol "TOF" based on the modified imaging condition of the protocol "TOF".

Thus, when an imaging condition included in a protocol is modified, the estimation function 15b recalculates the estimation temperature (terminal temperature) when the protocol is executed based on the modified imaging condition. That is, the estimation function 15b recalculates the estimation temperature (terminal temperature) when the protocol is executed based on the imaging condition after the imaging condition is modified.

The estimation function 15b calculates the temperature of the cooling water so that the temperature of the gradient coil 2 during the execution of the protocol "TOF" is approximated to the average temperature, based on the estimated temperature "35 degrees" of the gradient coil 2 at the time of executing the protocol "TOF" and the average temperature that has already been estimated. For example, as shown in the example in FIG. 13, to approximate the temperature of the gradient coil 2 when a predetermined time of several seconds to several tens of seconds has passed since start of execution of the protocol "TOF" to the average temperature "24 degrees", the estimation function 15b sets "27 degrees" as the temperature of the gradient coil 2 at this timing. Furthermore, for the same reason, the estimation function 15b sets "28 degrees" as the temperature of the gradient coil a predetermined time of several seconds to several tens of seconds before the execution of the protocol "TOF" is completed. Moreover, as shown in the example in FIG. 13, the estimation function 15b calculates "10 degrees" as the temperature of the cooling water when a predetermined time of several seconds to several tens of seconds has passed since execution of "TOF" is started. Furthermore, the estimation function 15b calculates "18 degrees" as the temperature of the cooling water a predetermined time of several seconds to several tens of seconds before completion of the execution of the protocol "TOF". Subsequently, the estimation function 15b updates a part of the protocol "TOF" of the temperature control data by using the estimated temperature of the gradient coil 2, the set temperature of the gradient coil 2, and the calculated temperature of the cooling water.

The setting function 15a transmits sequence execution data that corresponds to the protocol "TOF" to the sequence control function 13a of the processing circuitry 13 similarly to the processing at step S202 described above, when it comes to the time of executing the protocol "TOF", and the temperature control function 15c transmits a part of the temperature control data corresponding to the protocol "TOF" to the cooling system 200. Thus, even when an imaging condition of a protocol is modified during an examination, temperature control of the gradient coil 2 based on the imaging condition of the protocol after the modification is made thereto can be performed.

Furthermore, according to the first modification, similarly to the first embodiment, information that is useful for suppressing an influence of a change in temperature of the gradient coil 2 with time to an examination result can be estimated.

(Second Modification According to Embodiment)

The MRI apparatus 100 described above can estimate the temperature of the gradient coil 2 at the time of executing multiple protocols, even when an order to execute the multiple protocols is changed during an examination, based on imaging conditions of the multiple protocols, the execution of which has been changed, and can control the temperature of the gradient coil 2 based on the estimated temperature and the like. Therefore, such an embodiment is explained as a second modification of the embodiment.

For example, a case in which an order that the protocol "T1WI" is executed after the protocol "T2WI" shown in the example in FIG. 8 is changed to an order that the protocol "T2WI" is executed after the protocol "T2WI" by an operator is explained. In this case, the estimation function 15b according to the second modification estimates, similarly to the processing at step S102 described above, the temperature of the gradient coil 2 at the time of executing the protocol "T1WI" and the protocol "T2WI" based on the imaging conditions of the protocol "T1WI." and the protocol "T2WI" for which the order has been changed.

FIG. 14 is a table for explaining one example of processing that is performed by the estimation function according to the second modification. As shown in the example in FIG. 14, the estimation function 15b according to the second modification estimates temperature "25 degrees" of the gradient coil 2 at the time of executing the protocol "T1WI." based on the imaging condition of the protocol "T1WI". Moreover, the estimation function 15b according to the second modification estimates temperature "25 degrees" of the gradient coil at the time of executing the protocol "T2WI" based on the imaging condition of the protocol "T2WI". Thus, the estimation function 15b recalculates, when the order to execute multiple protocols is changed, the estimation temperature (terminal temperature) at the time of executing each of the protocols based on the imaging conditions that are included in the multiple protocols for which the order has been changed.

Subsequently, the estimation function 15b calculates, similarly to the processing at step S104 described above, the temperature of the cooling water to approximate the temperature of the gradient coil 2 to the average temperature at the time of executing the protocol "T1WI", based on the estimated temperature "25 degrees" of the gradient coil 2 at the time of executing the protocol "T1WI", and the average temperature that has already been estimated.

Furthermore, the estimation function 15b calculates, similarly to the processing at step S104 described above, the temperature of the cooling water to approximate the temperature of the gradient coil 2 at the time of executing the protocol "T2WI", based on the estimated temperature "25 degrees" of the gradient coil 2 at the time of executing the protocol "T2WI", and the average temperature that has already been estimated.

Furthermore, for example, as shown in the example in FIG. 14, to approximate the temperature of the gradient coil 2 when a predetermined time of several seconds to several tens of seconds has passed since execution of the protocol "T1WI" is started to the average temperature "24 degrees", the estimation function 15b sets "25 degrees" as the temperature of the gradient coil at this timing. Moreover, for the same reason, the estimation function 15b set "24 degrees" as the temperature of the gradient coil 2 at a timing when a predetermined time of several seconds to several tens of seconds before the execution of the protocol "T1WI" is completed.

Furthermore, as shown in the example in FIG. 14, to approximate the temperature of the gradient coil 2 to the average temperature "24 degrees" when a predetermined time of several seconds to several tens of seconds has passed since execution of the protocol "T2WI" is started, the estimation function 15b sets "24 degrees" as the temperature of the gradient coil 2 at this timing. Moreover, for the same reason, the estimation function 15b sets "23 degrees" as the temperature of the gradient coil 2 at a timing when a predetermined time of several seconds to several tens of seconds before the execution of the protocol "T2WI" is completed.

Furthermore, as shown in the example in FIG. 14, the estimation function 15b calculates "20 degrees" as the temperature of the cooling water when a predetermined time of several seconds to several tens of seconds has passed since execution of the protocol "T1WI" is started. Moreover, the estimation function 15b calculates "20 degrees" as the temperature of the cooling water at a timing when a predetermined time of several seconds to several tens of seconds before the execution of the protocol "T1WI" is completed.

Furthermore, as shown in the example in FIG. 14, the estimation function 15b calculates "20 degrees" as the temperature of the cooling water when a predetermined time of several seconds to several tens of seconds has passed since execution of the protocol "T2WI" is started. Moreover, the estimation function 15b calculates "16 degrees" as the temperature of the cooling water at a timing when a predetermined time of several seconds to several tens of seconds before the execution of the protocol "T2WI" is completed.

Subsequently, the estimation function 15b updates a part of the protocol "T1WI" and a part of the protocol "T2WI" of the temperature control data by using the estimated temperature of the gradient coil 2, the set temperature of the gradient coil 2, and the calculated temperature of the cooling water.

The setting function 15a transmits sequence execution data that corresponds to the protocol "T1WI" to the sequence control function 13a of the processing circuitry 13 when the time to execute the protocol "T1WI" has come similarly to the processing at step S202 described above, and the temperature control function 15c transmits a part of the temperature control data corresponding to the protocol "T1WI" to the cooling system 200. Similarly, the Getting function 15a transmits sequence execution data that corresponds to the protocol "T2WI" to the sequence control function 13a of the processing circuitry 13 when the time to execute the protocol "T2WI" has come similarly to the processing at step S202 described above, and the temperature control function 15c transmits a part of the temperature control data corresponding to the protocol "T2WI" to the cooling system 200. Thus, even when an imaging condition of a protocol is modified during an examination, temperature control of the gradient coil 2 based on the imaging condition of the protocol after the modification is made thereto can be performed.

Furthermore, according to the second modification, similarly to the first embodiment, information that is useful for suppressing an influence of a change in temperature of the gradient coil 2 with time to an examination result can be estimated.

(Third Modification According to Embodiment)

Moreover, the MRI apparatus 100 described above can estimate, even when a protocol is deleted during an examination, the temperature of the gradient coil at the time of executing a protocol that is executed later than the deleted protocol based on an imaging condition of the protocol that is executed later than the deleted protocol, and can control the temperature of the gradient coil 2 based on the estimated temperature and the like. Therefore, such an embodiment is explained as a third modification of the embodiment.

For example, a case in which the protocol "3D" shown in the example in FIG. 8 is deleted by an operator is explained. In this case, similarly to the processing at step S102 described above, the estimation function 15b according to the third modification estimates the temperature of the gradient coil 2 at the time of executing the protocol "T2*WI" based on the imaging condition of the protocol "T2WI" that is executed later than the deleted protocol "3D". Thus, the estimation function 15b recalculates, when at least one of multiple protocols is deleted, the estimation temperature (terminal temperature) in the case of executing a protocol later in an execution sequence based on an imaging condition of a protocol later in the execution sequence than the deleted protocol. That is, the estimation function 15b recalculates, when at least one of multiple protocols is deleted, the estimation temperature (terminal temperature) based on an imaging condition of the protocols subsequent to the deleted at least one of the multiple protocols.

FIG. 15 is a table for explaining one example of processing that is performed by the estimation function according to the third modification. As shown in the example in FIG. 15, the estimation function 15b according to the third modification estimates the temperature "25 degrees" of the gradient coil at the time of executing the protocol "T2*WI" based on the imaging condition of the protocol "T2*WI".

The estimation function 15b then calculates, similarly to the processing at step S104, the temperature of the cooling water so that the temperature of the gradient coil 2 at the time of executing the protocol "T2*WI" is approximated to the average temperature, based on the estimate temperature of the gradient coil 2 at the time of executing the protocol "T2*WI" and the average temperature that has already been estimated. For example, as shown in the example in FIG. 15, to approximate the temperature of the gradient coil 2 when a predetermined time of several seconds to several tens of seconds has passed since execution of the protocol "T2WI" is started to the average temperature "24 degrees", the estimation function 15b sets "25 degrees" as the temperature of the gradient coil 2 at this timing. Moreover, for the same reason, the estimation function 15b sets "25 degrees" as the temperature of the gradient coil 2 at a timing when a predetermined time of several seconds to several tens of seconds before the execution of the protocol "T2*WI" is completed. Furthermore, as shown in the example in FIG. 15, the estimation function 15b calculates "20 degrees" as the temperature of the cooling water when a predetermined time of several seconds to several tens of seconds has passed since execution of the protocol "T2*WI" is started. Moreover, the estimation function 15b calculates "20 degrees" as the temperature of the cooling water at a timing when a predetermined time of several seconds to several tens of seconds before the execution of the protocol "T2*WI" is completed. Subsequently, the estimation function 15b updates a part of the protocol "T2*WI" of the temperature control data by using the estimated temperature of the gradient coil 2, the set temperature of the gradient coil 2, and the calculated temperature of the cooling water.

Subsequently, the setting function is a transmits sequence execution data that corresponds to the protocol "T2WI" to the sequence control function 13a of the processing circuitry 13 when the time to execute the protocol "T2*WI" has come, and the temperature control function 15c transmits a part of the temperature control data corresponding to the protocol "T2*WI" to the cooling system 200. Thus, even when an imaging condition of a protocol is modified during an examination, temperature control of the gradient coil 2 based on the imaging condition of the protocol after the modification is made thereto can be performed.

Furthermore, according to the third modification, similarly to the first embodiment, information that is useful for suppressing an influence of a change in temperature of the gradient coil 2 with time to an examination result can be estimated.

In the first modification, when an imaging condition of a protocol is modified during an examination, and when the protocol "shimming" is included in set multiple protocols and this protocol "shimming" has not been executed, the estimation function 15b can further estimate an average temperature similarly to the processing at step S103 described above. Moreover, in the second modification, when an order to execute protocols is changed during an examination, and when the protocol "shimming" is included in set multiple protocols and this protocol "shimming" has not been executed, the estimation function 15b can further estimate an average temperature similarly to the processing at step S103 described above. Furthermore, in the third modification, when a protocol is deleted during an examination, and when the protocol "shimming" is included in set multiple protocols and this protocol "shimming" has not been executed, the estimation function 15b can further estimate an average temperature similarly to the processing at step S103 described above. In these cases, the estimation function 15b sets, similarly to the processing at step S104 described above, the temperature of the gradient coil 2 so that the temperature of the gradient coil 2 at the time of executing the protocol "shimming" is approximated to the estimated average temperature.

(Fourth Modification According to Embodiment)

Moreover, even when an imaging condition of a protocol is modified, an order to execute multiple protocols is changed, or a protocol is deleted, the MRI apparatus 100 described above can execute the protocol "shimming" when receiving an instruction to execute the protocol "shimming" by displaying a screen to prompt an operator to execute the protocol "shimming" to measure a center frequency of an RF pulse. Therefore, such an embodiment is explained as a fourth modification of the embodiment.

For example, in the following, a case in which a modification is made to an imaging condition of a protocol during an examination is explained as an example. However, the same processing can be performed also when an order to execute multiple protocols is changed during an execution, and also when at least one of protocols is deleted. That is, the same processing can be performed in at least one of cases when an imaging condition of a protocol is modified, when an order to execute multiple protocols is changed, and when a protocol is deleted. When an imaging condition of a protocol is modified during an examination, the estimation function 15b according to the fourth modification estimates the temperature of the gradient coil 2 at the time of executing each of multiple protocols based on imaging conditions of all of the set protocols including the protocol to which the modification is made, similarly to the processing at step S102 described above.

Furthermore, the estimation function 15b estimates the average temperature of the gradient coil 2 in the examination performed on the subject S based on the estimate temperature, similarly to the processing at step S103 described above.

Subsequently, the setting function 15a determines whether a difference between the average temperature (average temperature obtained by estimation this time) re-estimated by the estimation function 15b and the average temperature that is estimated at previous time is equal to or larger than a predetermined threshold. When it is equal to or larger than the predetermined threshold, the estimation function 15b displays a screen to prompt an operator to execute the protocol "shimming" to measure a center frequency of an RF pulse on the display 10.

Figure 16:
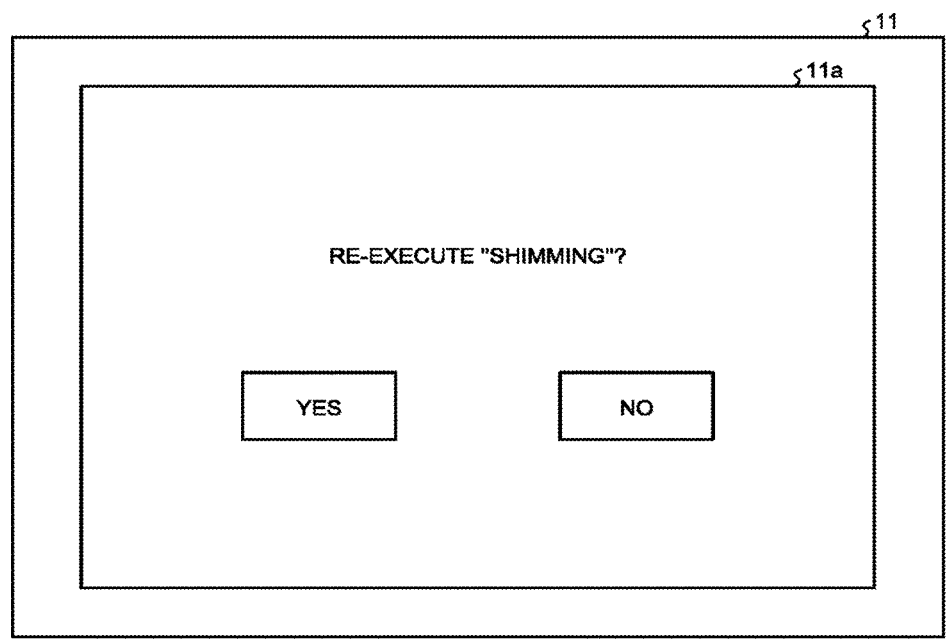
FIG. 16 is a diagram showing one example of a screen to prompt an operator to execute a protocol "shimming" to measure a center frequency of an RF pulse.

FIG. 16 is a diagram showing one example of a screen to prompt an operator to execute the protocol "shimming" to measure a center frequency of an RF pulse. For example, the setting function 15a displays a screen 11a to prompt an operator to execute the protocol "shimming" on the display 10 as shown in the example in FIG. 16. Thus, the setting function 15a controls the display 10 to display an alert to suggest re-execution of measuring a data used to set a center frequency of an RF pulse. In the screen 11a, a button labeled "Yes" to receive an instruction to execute the protocol "shimming" and a button labeled "No" to close the screen 11a are included.

The setting function 15a transmits sequence execution data that corresponds to the protocol "shimming" the sequence control function 13a when determining that the button labeled "Yes" is pressed by an operator through the input circuitry 9. Thus, the protocol "shimming" is executed. Moreover, the setting function 15a closes the screen 11a when determining that the button labeled "No" is pressed by the operator through the input circuitry 9.

As above, the fourth modification has been explained. According to the MRI apparatus 100 according to the fourth modification, when re-measurement of a center frequency of an RF pulse is necessary as an average temperature significantly changes, such as when a difference between an average temperature that is re-estimated and an average temperature that has estimated at previous time is equal to or larger than a predetermined threshold, execution of the protocol "shimming" is prompted to an operator. Therefore, according to the MRI apparatus 100 according to the fourth modification, when re-measurement of a center frequency of an RF pulse is necessary, the re-measurement can be prompted to an operator.

Moreover, according to the fourth modification, similarly to the first embodiment, information that is useful for suppressing an influence of a change in temperature of the gradient coil 2 with time to an examination result can be estimated.

(Fifth Modification According to Embodiment)

Furthermore, in the above embodiment, a case in which a temperature obtained by combining a temperature of a coil corresponding to the X axis, a temperature of a coil corresponding to the Y axis, and a temperature of a coil corresponding to the Z axis, and a temperature of other parts as necessary is regarded as the temperature of the gradient coil 2 has been explained. However, the MRI apparatus 100 can handle a temperature of each of coils corresponding to the coil corresponding to the X axis, the coil corresponding to the Y axis, and the coil corresponding to the Z axis included in the gradient coil 2 independently, to perform temperature control individually. Therefore, such an embodiment is explained as a fifth modification of the embodiment.

Figure 17:
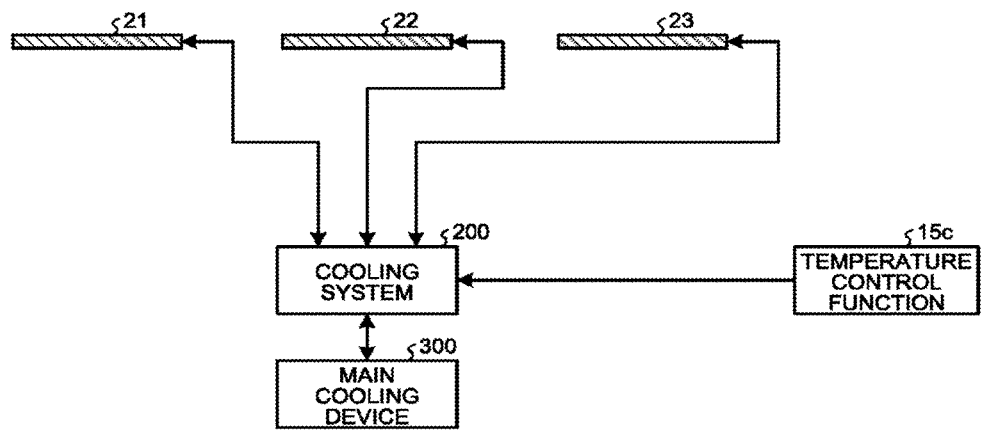
FIG. 17 is a diagram for explaining a fifth modification.

FIG. 17 is a diagram for explaining the fifth modification. As shown in the example in FIG. 17, in the MRI apparatus 100 according to the fifth modification, so as to be able to provide cooling water independently to each of a coil 21 corresponding to the X axis, a coil 22 corresponding to the Y axis, and a coil 23 corresponding to the Z axis, each coil and the cooling system 200 are connected through flowing paths.

In the embodiment described above, a case in which temperature-control-data generation processing and temperature control processing are performed, regarding a temperature obtained by combining a temperature of a coil corresponding to the X axis, a temperature of a coil corresponding to the Y axis, and a temperature coil corresponding to the Z axis as the temperature of the gradient coil 2 has been explained.

The MRI apparatus 100 according to the fifth modification performs processing similar to the temperature-control-data generation processing and the temperature control processing described above per coil of the coil 21, the coil 22, and the coil 23. Thus, the estimation function 15b according to the fifth modification estimates an average temperature of the coil in an examination per coil. That is, the estimation function 15b calculates an average temperature per coil as a target temperature of a coil in an examination. Therefore, according to the MRI apparatus 100 according to the fifth modification, information that is useful for suppressing an influence of a change in temperature of each coil with time to an examination result can be estimated.

Furthermore, in the embodiment and the respective modifications described above, a case in which the temperature of the gradient coil 2, and further, the temperature of the iron shim 2e is controlled by controlling the temperature of cooling water that is provided to the gradient coil 2 has been exemplified. However, as the amount of flow of the cooling water to be provided into the gradient coil 2 increases, the degree of decreasing the temperature of the gradient coil 2 increases. Therefore, the MRI apparatus 100 can control the temperature of the gradient coil 2, and further, the temperature of the iron shim 2e, by controlling the valves 240 and 250 to control the amount of flow of the cooling water that is provided into the gradient coil 2. Furthermore, the MRI apparatus 100 can control the temperature of the gradient coil 2 by controlling the temperature and the amount of flow of the cooling water to be provided into the gradient coil 2.

According to the MRI apparatus according to at least one of the embodiment and the modifications, information that is useful for suppressing an influence of a change in temperature of the gradient coil 2 with time to an examination result can be estimated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic-resonance imaging apparatus, comprising:
a gradient coil configured to apply a gradient magnetic field to an imaging space in which a subject is placed;
a transmitter coil configured to apply a RF (radio frequency) pulse to the imaging space; and
processing circuitry configured to calculate a target temperature of the gradient coil throughout a plurality of protocols to be executed in an examination of the subject, control a temperature of the gradient coil to approach the target temperature when data used to set a center frequency of the RF pulse is measured, generate image data based on MR signal data acquired by executing the plurality of protocols, and display an image based on the generated image data on a display.

2. The magnetic-resonance imaging apparatus according to claim 1, wherein
the processing circuitry is further configured to calculate a terminal temperature value of the gradient coil corresponding to each of the plurality of protocols, and calculate the target temperature according to the calculated terminal temperature values.

3. The magnetic-resonance imaging apparatus according to claim 2, wherein
the processing circuitry is further configured to calculate an average of the calculated terminal temperature values corresponding to the plurality of protocols to be executed in the examination, as the target temperature.

4. The magnetic-resonance imaging apparatus according to claim 1, wherein
the processing circuitry is further configured to control a display to display an alert to suggest re-execution of measuring the data used to set the center frequency of the RF pulse when at least one of cases when an imaging condition included in one of the protocols is modified, when an order to execute the plurality of protocols is changed, and when one of the protocols is deleted.

5. The magnetic-resonance imaging apparatus according to claim 1, wherein
the processing circuitry is further configured to re-calculate, when an imaging condition included in a particular protocol is modified, a terminal temperature value when the particular protocol is executed based on the imaging condition after the imaging condition is modified.

6. The magnetic-resonance imaging apparatus according to claim 1, wherein
the processing circuitry is further configured to re-calculate, when an order to execute the plurality of protocols is changed, a terminal temperature value at a time of executing each of the plurality of protocols, based on the imaging condition included in the plurality of protocols for which the order to execute is changed.

7. The magnetic-resonance imaging apparatus according to claim 1, wherein
the processing circuitry is further configured to re-calculate, when at least one protocol of the plurality of protocols is deleted, a terminal temperature value based on an imaging condition of protocols subsequent to the deleted at least one protocol.

8. The magnetic-resonance imaging apparatus according to claim 1, wherein
the processing circuitry is further configured to control a temperature of the gradient coil during execution of a particular protocol of the plurality of protocols to adjust homogeneity of a static magnetic field to approach the target temperature.

9. The magnetic-resonance imaging apparatus according to claim 8, further comprising:
a metal shim configured to be provided at the gradient coil, and adjust inhomogeneity of the static magnetic field, wherein
the processing circuitry is further configured to control a temperature of the metal shim.

10. The magnetic-resonance imaging apparatus according to claim 1, wherein
the gradient coil includes a plurality of coils configured to correspond to an X axis, a Y axis, and a Z axis, respectively, and
the processing circuitry is further configured to calculate the target temperature per each of the coils.

* * * * *